(12) United States Patent
Wang et al.

(10) Patent No.: US 10,330,965 B2
(45) Date of Patent: Jun. 25, 2019

(54) DISPLAY PANEL AND MANUFACTURING METHOD THEREOF, DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Junwei Wang, Beijing (CN); Xiaopeng Cui, Beijing (CN); Weitao Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 238 days.

(21) Appl. No.: 15/321,552

(22) PCT Filed: Mar. 24, 2016

(86) PCT No.: PCT/CN2016/077239
§ 371 (c)(1),
(2) Date: Dec. 22, 2016

(87) PCT Pub. No.: WO2016/169382
PCT Pub. Date: Oct. 27, 2016

(65) Prior Publication Data
US 2017/0205644 A1    Jul. 20, 2017

(30) Foreign Application Priority Data
Apr. 21, 2015  (CN) .......................... 2015 1 0191026

(51) Int. Cl.
H02H 9/00       (2006.01)
G02F 1/1333    (2006.01)
(Continued)

(52) U.S. Cl.
CPC ............ *G02F 1/1333* (2013.01); *G09F 9/301* (2013.01); *H01L 21/77* (2013.01); *H01L 27/12* (2013.01);
(Continued)

(58) Field of Classification Search
USPC .......................................... 361/56
See application file for complete search history.

(56) References Cited

U.S. PATENT DOCUMENTS

| | | | |
|---|---|---|---|
| 7,961,262 B2 * | 6/2011 | Liu ........................ | C09K 19/52 349/106 |
| 8,368,145 B2 * | 2/2013 | Fukuoka ........... | H01L 27/14603 257/355 |

(Continued)

FOREIGN PATENT DOCUMENTS

| | | |
|---|---|---|
| CN | 1700976 A | 11/2005 |
| CN | 1996133 A | 7/2007 |

(Continued)

OTHER PUBLICATIONS

"Fourth office action," CN Application No. 201510191026.3 (dated Apr. 27, 2018).
(Continued)

*Primary Examiner* — Ronald W Leja
(74) *Attorney, Agent, or Firm* — Womble Bond Dickinson (US) LLP

(57) ABSTRACT

Embodiments of this disclosure disclose a display panel and a manufacturing method thereof, as well as a display device. The display panel comprises an upper substrate and a lower substrate arranged opposite to each other and packaged together, and further comprises an electrically controlled deformable film arranged on a surface of the upper substrate facing away from the lower substrate. The electrically controlled deformable film is configured to adjust its cur-
(Continued)

vature based on a voltage applied on the electrically controlled deformable film, and enable a curvature of the upper substrate and a curvature of the lower substrate to be adjusted synchronously.

19 Claims, 4 Drawing Sheets

(51) Int. Cl.
*H01L 21/77* (2017.01)
*H01L 27/12* (2006.01)
*H02H 7/20* (2006.01)
*G09F 9/30* (2006.01)

(52) U.S. Cl.
CPC ... *H02H 7/20* (2013.01); *G02F 2001/133394* (2013.01); *G02F 2201/503* (2013.01)

(56) References Cited

U.S. PATENT DOCUMENTS

| | | | | |
|---|---|---|---|---|
| 8,958,026 | B2* | 2/2015 | Park | G02F 1/133305 349/58 |
| 2013/0329422 | A1 | 12/2013 | Park et al. | |
| 2014/0055394 | A1* | 2/2014 | Park | H01L 41/0825 345/173 |

FOREIGN PATENT DOCUMENTS

| | | |
|---|---|---|
| CN | 101377913 A | 3/2009 |
| CN | 101441381 A | 5/2009 |
| CN | 101838385 A | 9/2010 |
| CN | 103489380 A | 1/2014 |
| CN | 103645749 A | 3/2014 |
| CN | 104197240 A | 12/2014 |
| CN | 104766870 A | 7/2015 |

OTHER PUBLICATIONS

Office Action in Chinese Application No. 201510191026.3 dated Aug. 17, 2017, with English translation.
Office Action in Chinese Application No. 201510191026.3 dated Apr. 1, 2017, with English translation. 9 pages.
"Third office action," CN Application No. 201510191026.3 (dated Feb. 27, 2018).
International Search Report with English Language Translation, dated Jul. 6, 2016, PCT Application No. PCT/CN2016/077239.

* cited by examiner

DISPLAY PANEL AND MANUFACTURING METHOD THEREOF, DISPLAY DEVICE

TECHNICAL FIELD

The present disclosure relates to the field of display technology, particularly to a display panel and a manufacturing method thereof, as well as a display device.

BACKGROUND

With the development of the display technology and the increase of the display requirement, the requirement on the display device, especially the curved surface display device, has also increased gradually. The advantage of the curved surface display device lies in that when the viewer is at an appropriate position, the distance from the eyes to each point of the display panel of the curved surface display device is substantially the same, which can achieve a better viewing effect theoretically.

In the prior art, the display panel is generally bended using mechanical forces, and then its shape is fixed through a shape-fixed curved back plate, finally a curved surface display device is formed. However, after a curved surface display panel is formed by bending the display panel through mechanical forces, the curvature of the display panel is fixed. When the viewer is at different positions or at an inappropriate position, the distance from the eyes of the viewer to each point of the display panel of the curved surface display device will be greatly different, such that the viewing effect is not good.

Therefore, the curved surface display device manufactured based on the prior art cannot adapt to the change of the viewer position and lacks flexibility.

SUMMARY

Therefore, it is desired to provide a display panel and a manufacturing method thereof, as well as a display device, so as to mitigate or avoid the problem that the curved surface display device in the prior art cannot adapt to change of the position of the viewer and lacks flexibility. An embodiment of the present disclosure provides a display panel, comprising an upper substrate and a lower substrate arranged opposite to each other and packaged together. The display panel further comprises an electrically controlled deformable film. The electrically controlled deformable film is arranged on a surface of the upper substrate facing away from the lower substrate.

The electrically controlled deformable film is configured to adjust its curvature based on a voltage applied on the electrically controlled deformable film, and enable a curvature of the upper substrate and a curvature of the lower substrate to be adjusted synchronously.

In this embodiment, by arranging the curvature adjustable electrically controlled deformable film on the surface of the upper substrate facing away from the lower substrate, when the curvature of the display panel needs to be adjusted, the voltage applied on the electrically controlled deformable film can be changed, such that the curvature of the electrically controlled deformable film is changed and the upper substrate and the lower substrate that are packaged together are driven to change their curvatures synchronously, so as to adapt to the change of the viewer position and adjust the curvature of the display panel flexibly.

According to another embodiment, shape and size of the electrically controlled deformable film match with the upper substrate, and two opposite ends of the electrically controlled deformable film are electrically connected with a power source signal line and a ground signal line on the lower substrate respectively. The electrically controlled deformable film can also be connected with a power source and terrestrial electricity outside the display panel, i.e., supplying power for the electrically controlled deformable film outside the display panel. However, for the consideration of simplifying the external structure of the display panel and reducing the overall volume of the display panel, in this embodiment, the different ends of the electrically controlled deformable film are electrically connected with the power source signal line and the ground signal line of the lower substrate directly, i.e., the power source line and the ground signal line are arranged on the lower substrate, so as to reduce the overall volume of the display panel.

According to another embodiment, a power supply protection circuit electrically connected with the power source signal line is disposed on a surface of the lower substrate facing towards the upper substrate, and one of the two opposite ends of the electrically controlled deformable film is electrically connected with the power supply protection circuit through a first electrically conductive component. In this embodiment, the power supply circuit of the electrically controlled deformable film is protected by the power supply protection circuit.

According to another embodiment, the power supply protection circuit comprises a first thin film transistor. A gate electrode and a source electrode of the first thin film transistor are electrically connected with the power source signal line, and a drain electrode of the first thin film transistor is electrically connected with the first electrically conductive component. In this embodiment, the first thin film transistor connected in the form of diodes is taken as the power supply protection circuit. Such a power supply protection circuit is easy to be implemented. In addition, when the lower substrate is an array substrate, a power supply protection circuit can be formed simultaneously with the thin film transistors for driving the pixel array on the lower substrate, thus the process can be saved.

According to another embodiment, an ESD protection circuit electrically connected with the ground signal line is disposed on the surface of the lower substrate facing towards the upper substrate, and the other of two opposite ends of the electrically controlled deformable film is electrically connected with the ESD protection circuit through a second electrically conductive component. In this embodiment, by arranging the ESD protection circuit electrically connected with the electrically controlled deformable film, the electrically controlled deformable film can serve as the ESD protection layer of the display panel, for providing ESD protection for the display panel.

According to another embodiment, the ESD protection circuit comprises a second thin film transistor and a third thin film transistor. A gate electrode and a source electrode of the second thin film transistor, and a drain electrode of the third thin film transistor are electrically connected with the second electrically conductive component. A drain electrode of the second thin film transistor, and a gate electrode and a source electrode of the third thin film transistor are electrically connected with the ground signal line. In this embodiment, the second thin film transistor and the third thin film transistor connected in the form of diodes are taken as the ESD protection circuit. Such a power supply protection circuit can be implemented easily. In addition, when the lower substrate is an array substrate, an ESD protection circuit can be formed simultaneously with the thin film transistors for driving the pixel array on the lower substrate, thus the process can be saved.

According to another embodiment, the first electrically conductive component and the second electrically conductive component are silver points. In this embodiment, the silver points have good conductivity and deformability.

According to another embodiment, a material of the electrically controlled deformable film is an electro deformable material. In this embodiment, the electro deformable material has both conductivity and good shape memory function. The curvature of the electrically controlled deformable film can be changed by adjusting the voltage applied on it, thereby enabling the curvatures of the upper substrate and the lower substrate that are packaged together to be adjusted synchronously, thus, the curvature of the display panel can be adjusted flexibly.

According to another embodiment, a thickness of the electrically controlled deformable film is 100 μm to 200 μm.

According to another embodiment, the lower substrate is an array substrate, and the upper substrate is a color film substrate or a package substrate.

By arranging the curvature adjustable electrically controlled deformable film on the surface of the upper substrate facing away from the lower substrate, when the curvature of the display panel needs to be adjusted, the voltage applied on the electrically controlled deformable film can be changed, such that the curvature of the electrically controlled deformable film is changed and the upper substrate and the lower substrate that are packaged together are driven to change their curvatures synchronously, so as to adapt to the change of the viewer position and adjust the curvature of the display panel flexibly.

An embodiment of the present disclosure provides a display device, comprising the display panel provided by any of the embodiments as above.

By arranging the curvature adjustable electrically controlled deformable film on the surface of the upper substrate of the display panel facing away from the lower substrate, when the curvature of the display panel needs to be adjusted, the voltage applied on the electrically controlled deformable film can be changed, such that the curvature of the electrically controlled deformable film is changed and the upper substrate and the lower substrate that are packaged together are driven to change their curvatures synchronously, so as to adapt to the change of the viewer position and adjust the curvature of the display panel flexibly.

An embodiment of the present disclosure provides a manufacturing method of a display panel, comprising:

packaging an upper substrate and a lower substrate;

forming an electrically controlled deformable material coating on a surface of the upper substrate facing away from the lower substrate;

bending the upper substrate with the electrically controlled deformable material coating and the lower substrate, after drying the electrically controlled deformable material coating to form an electrically controlled deformable film, cooling the electrically controlled deformable film.

According to another embodiment, forming an electrically controlled deformable material coating on a surface of the upper substrate facing away from the lower substrate comprises: after coating an electrically controlled deformable material on the surface of the upper substrate facing away from the lower substrate, forming an electrically controlled deformable material coating through natural volatilization or prebaking of 30 degrees Celsius.

According to another embodiment, the method can further comprise:

prior to packaging the upper substrate and the lower substrate, forming a power source signal line and a ground signal line on the lower substrate; and after cooling the electrically controlled deformable film, forming a first electrically conductive component electrically connected with the power source signal line and a second electrically conductive component electrically connected with the ground signal line on different ends of the electrically controlled deformable film respectively.

According to another embodiment, the method can further comprise: prior to packaging the upper substrate and the lower substrate, forming a power supply protection circuit and an ESD protection circuit on the lower substrate, the power supply protection circuit being electrically connected with the power source signal line, and the ESD protection circuit being electrically connected with the ground signal line.

By arranging the curvature adjustable electrically controlled deformable film on the surface of the upper substrate of the display panel facing away from the lower substrate, when the curvature of the display panel needs to be adjusted, the voltage applied on the electrically controlled deformable film can be changed, such that the curvature of the electrically controlled deformable film is changed and the upper substrate and the lower substrate that are packaged together are driven to change their curvatures synchronously, so as to adapt to the change of the viewer position and adjust the curvature of the display panel flexibly.

DETAILED DESCRIPTION OF THE DISCLOSURE

Next, the implementation process of embodiments of the present disclosure will be explained in detail with reference to the drawings. It should be noted that the same or similar reference signs represent the same or similar elements or elements having the same or similar functions all through. The embodiments below described by making reference to the drawings are exemplary, which are only used for explaining the present disclosure and could not be understood as limitations to the present disclosure.

Figure 1:
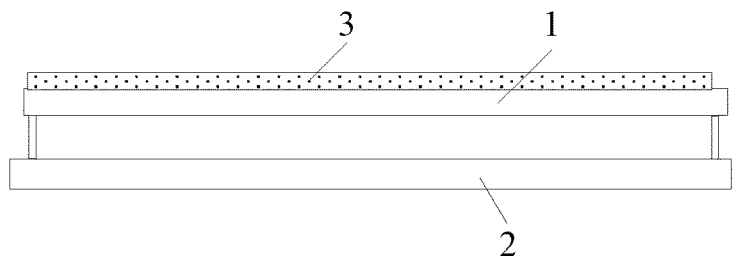
FIG. 1 is a structural schematic view of a display panel provided by an embodiment of the present disclosure.

Referring to FIG. 1, an embodiment of the present disclosure provides a display panel, comprising an upper substrate 1 and a lower substrate 2 arranged opposite to each other and packaged together. The display panel further comprises an electrically controlled deformable film 3. The electrically controlled deformable film 3 is arranged on a surface of the upper substrate 1 facing away from the lower substrate 2.

The electrically controlled deformable film 3 is configured to adjust its curvature based on a voltage applied on the electrically controlled deformable film 3, and enable a curvature of the upper substrate 1 and a curvature of the lower substrate 2 to be adjusted synchronously. For example, the electrically controlled deformable film 3 is configured to adjust its curvature based on an amplitude of the voltage applied on the electrically controlled deformable layer 3.

In this embodiment, by arranging the curvature adjustable electrically controlled deformable film 3 on the surface of the upper substrate 1 facing away from the lower substrate 2, when the curvature of the display panel needs to be adjusted, the voltage applied on the electrically controlled deformable film 3 can be changed, such that the curvature of the electrically controlled deformable film 3 is changed and the upper substrate 1 and the lower substrate 2 that are packaged together are driven to change their curvatures synchronously, so as to adapt to the change of the viewer position and adjust the curvature of the display panel flexibly.

Figure 2:
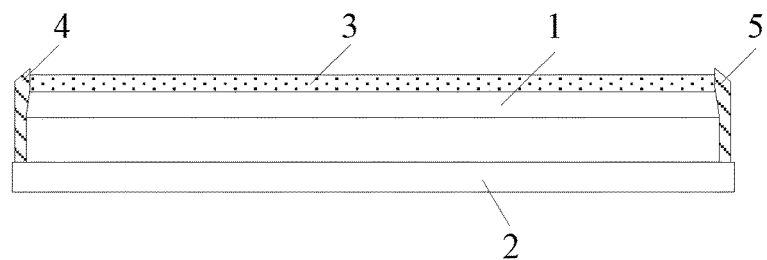
FIG. 2 is a structure schematic view of another display panel provided by an embodiment of the present disclosure.
Figure 3:
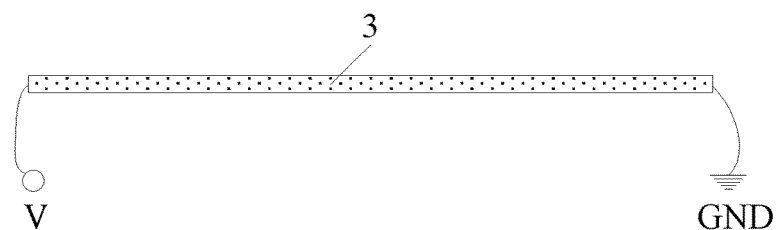
FIG. 3 illustrates electrical connection of an electrically controlled deformable film with a power source signal line and a ground signal line provided by an embodiment of the present disclosure.

The electrically controlled deformable film 3 can be formed by an electro deformable material. The electro deformable material can be electro deformable shape memory polymers (SMP). The electro deformable SMP material has both conductivity and good shape memory function. The curvature of the electrically controlled deformable film can be changed by adjusting the voltage applied on it, thereby enabling the curvatures of the upper substrate and the lower substrate packaged together to be adjusted synchronously, thus, the curvature of the display panel can be adjusted flexibly. According to another embodiment, shape and size of the electrically controlled deformable film 3 match with the upper substrate 1, and different ends of the electrically controlled deformable film 3 are electrically connected with a power source signal line and a ground signal line on the lower substrate 2 respectively. It should be noted that the different ends of the electrically controlled deformable film 3 can be adjacent ends of the electrically controlled deformable film 3, and can also be opposite sides. For example, in case the electrically controlled deformable film 3 is in a rectangle shape, the above mentioned different ends of the electrically controlled deformable film can be end portions to which two adjacent sides of the rectangle correspond, and can also be end portions to which the opposite sides of the rectangle correspond. In order to enable the deformation of the powered electrically controlled deformable film 3 to meet the deformation requirement of the display panel, the two opposite ends of the electrically controlled deformable film 3 may be chosen to be electrically connected with a power source signal line and a ground signal line on the lower substrate 2 respectively. The schematic view for this case is as shown in FIG. 3, one end of the electrically controlled deformable film 3 is electrically connected with a power source V, and the other end is electrically connected with the ground GND. Certainly, one or two ends in a plurality of end portions of the electrically controlled deformable film 3 can also be made to be electrically connected with the power source V, and one or two ends in other end portions not electrically connected with the power source V are made to be electrically connected with the ground GND. By enabling different ends of the electrically controlled deformable film 3 to be electrically connected with the power source signal line and the ground signal line respectively, the electrically controlled deformable film 3 can be controlled better, thereby avoiding local deformation to be too large or too small. Alternatively, the electrically controlled deformable film 3 can also be electrically connected with a power source and ground outside the display panel, i.e., supplying power for the electrically controlled deformable film 3 outside the display panel. However, for the consideration of simplifying the external structure of the display panel and reducing the overall volume of the display panel, for example, different ends of the electrically controlled deformable film 3 are electrically connected with the power source signal line and the ground signal line of the lower substrate 2 directly, i.e., the power source line and the ground signal line are arranged on the lower substrate, so as to reduce the overall volume of the display panel. As shown in FIG. 2, a first electrically conductive component 4 and a second electrically conductive component 5 are provided. One end of the electrically controlled deformable film 3 can be electrically connected with the power source signal line (not shown) on the lower substrate 2 through the first electrically conductive component 4, and the other end of the electrically controlled deformable film 3 can be electrically connected with the ground signal line (not shown) on the lower substrate 2 through the second electrically conductive component 5. Certainly, if the display panel is required to be a special curved surface when being deformed, the adjacent ends of the electrically controlled deformable film 3 can be made to be electrically connected with the power source signal line and the ground signal line on the lower substrate 2 respectively; alternatively, one end in a plurality of end portions of the electrically controlled deformable film 3 can be made to be electrically connected with the power source signal line on the lower substrate 2, and other ends are electrically connected with the ground signal line, which will not be repeated here.

Figure 4:
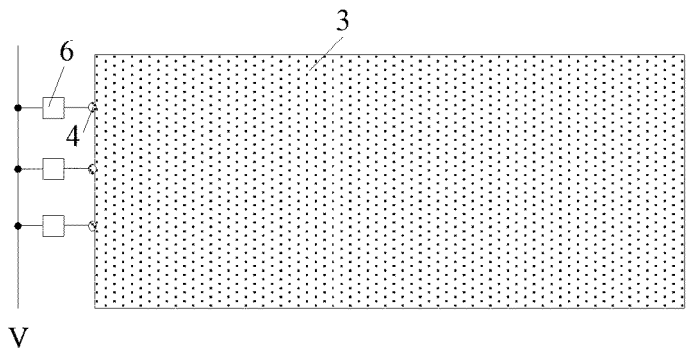
FIG. 4 is a local schematic view of a power supply protection circuit disposed between the electrically controlled deformable film and the power source signal line provided by an embodiment of the present disclosure.

In order to protect the power supply circuit of the electrically controlled deformable film and improve security of the display panel, the following configuration can be made: a power supply protection circuit 6 electrically connected with the power source signal line is disposed on a surface of the lower substrate 2 facing towards the upper substrate 1, and one of the two opposite ends of the electrically controlled deformable film 3 is electrically connected with the power supply protection circuit 6 through the first electrically conductive component 4. There may be more than one power supply protection circuit 6. FIG. 4 illustrates the connection of the power supply protection circuit 6 with the electrically controlled deformable film 3. In this embodiment, the power supply circuit of the electrically controlled deformable film 3 is protected by the power supply protection circuit 6.

Figure 5:
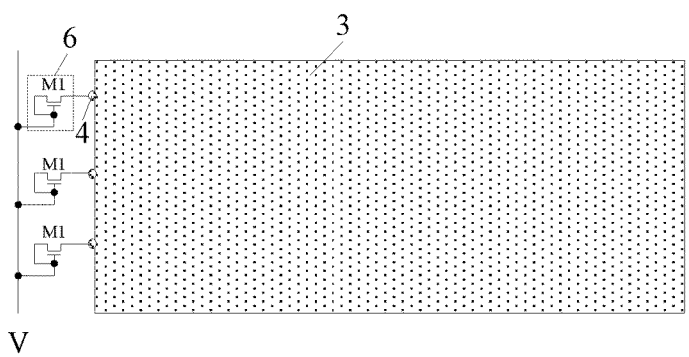
FIG. 5 is a specific local schematic view of a power supply protection circuit disposed between the electrically controlled deformable film and the power source signal line provided by an embodiment of the present disclosure.

According to another embodiment, the power supply protection circuit 6 comprises a first thin film transistor M1. The specific connection can be as shown in FIG. 5. A gate electrode and a source electrode of the first thin film transistor M1 are electrically connected with the power source signal line, and a drain electrode of the first thin film transistor M1 is electrically connected with the first electrically conductive component 4. In this embodiment, the first thin film transistor M1 connected in the form of diodes is taken as the power supply protection circuit 6. Such a power supply protection circuit can be implemented easily. In addition, in case the lower substrate 2 is an array substrate, the power supply protection circuit can be formed simultaneously with the thin film transistors for driving the pixel array on the lower substrate 2, thus the process can be saved.

Figure 6:
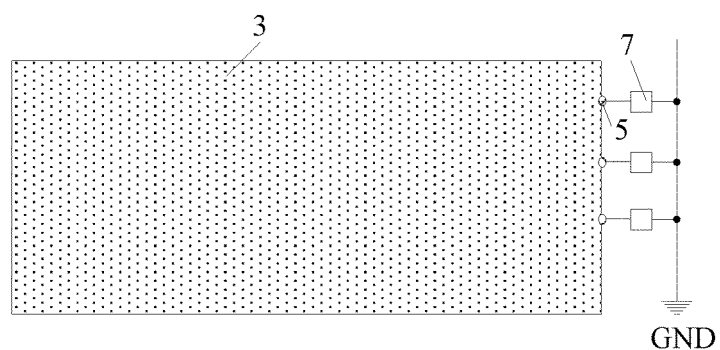
FIG. 6 is a local schematic view of an ESD protection circuit disposed between the electrically controlled deformable film and the ground signal line provided by an embodiment of the present disclosure.

In order to perform ESD protection to the display panel and improve security of the display panel, the following configuration can be made: an ESD protection circuit 7 electrically connected with the ground signal line is disposed on the surface of the lower substrate 2 facing towards the upper substrate 1, and the other of two opposite ends of the electrically controlled deformable film 3 is electrically connected with the ESD protection circuit 7 through the second electrically conductive component 5. There may be multiple ESD protection circuits 7. FIG. 6 illustrates the connection of the ESD protection circuit 7 with the electrically controlled deformable film 3. In this embodiment, by arranging the ESD protection circuit 7 electrically connected with the electrically controlled deformable film 3, the electrically controlled deformable film 3 can serve as the ESD protection layer of the display panel, for providing ESD protection for the display panel.

Figure 7:
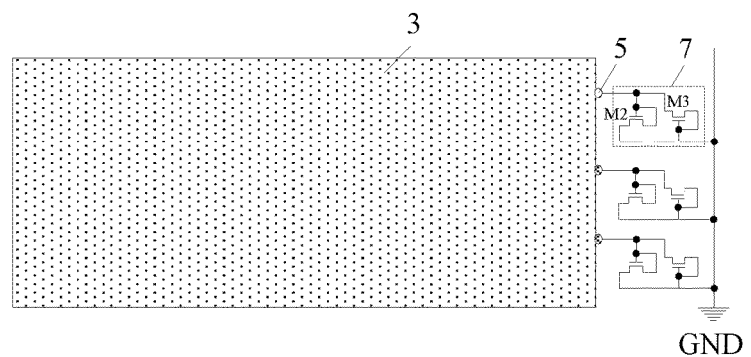
FIG. 7 is a specific local schematic view of an ESD protection circuit disposed between the electrically controlled deformable film and the ground signal line provided by an embodiment of the present disclosure.

According to another embodiment, the ESD protection circuit 7 comprises a second thin film transistor M2 and a third thin film transistor M3. The specific connection can be as shown in FIG. 7. A gate electrode and a source electrode of the second thin film transistor M2, and a drain electrode of the third thin film transistor M3 are electrically connected with the second electrically conductive component 5. A drain electrode of the second thin film transistor M2, and a gate electrode and a source electrode of the third thin film transistor M3 are electrically connected with the ground signal line. In this embodiment, the second thin film transistor M2 and the third thin film transistor M3 connected in the form of diodes are taken as the ESD protection circuit. Such a power supply protection circuit can be implemented easily. In addition, in case the lower substrate is an array substrate, the ESD protection circuit can be formed simultaneously with the thin film transistor for driving the pixel array on the lower substrate 2, thus the process can be saved.

The electrically controlled deformable film 3 for power supply circuit protection and ESD protection will be explained specifically in the following.

Figure 8:
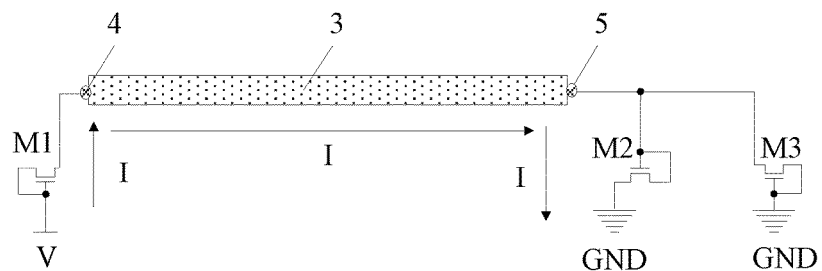
FIG. 8 is a schematic view of current flow direction when the display panel in the embodiment of the present disclosure is in a normal operation state.

As shown in FIG. 8, when the display panel is in a normal operation state, the power source V supplies a DC high level. The current I flows through the first thin film transistor M1, the electrically controlled deformable film 3, the second thin film transistor M2 successively, and finally to the ground GND.

Figure 9:
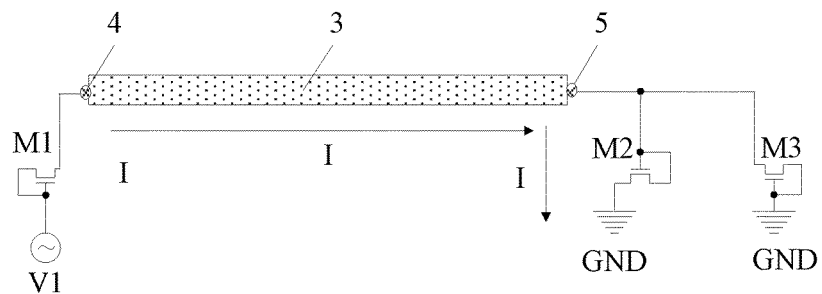
FIG. 9 is a schematic view of current flow direction when the display panel in the embodiment of the present disclosure is in a state of positive electrostatic discharge.

As shown in FIG. 9, when a substantial amount of positive charges are gathered on the surface of the display panel during operation, it can be regarded as supplying an AC voltage by the power source V1. The current I flows through the electrically controlled deformable film 3, the second thin film transistor M2 successively, and finally to the ground GND.

Figure 10:
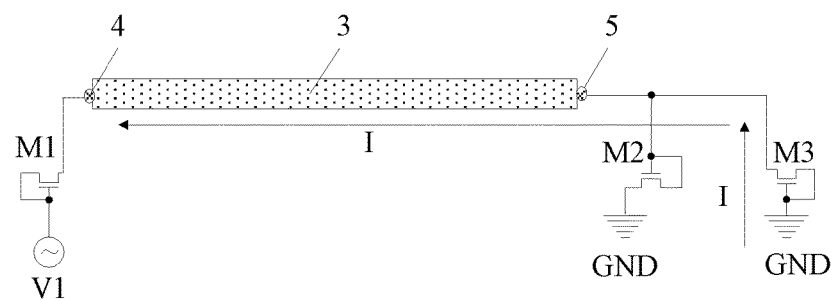
FIG. 10 is a schematic view of current flow direction when the display panel in the embodiment of the present disclosure is in a state of negative electrostatic discharge.

As shown in FIG. 10, when a substantial amount of negative charges are gathered on the surface of the display panel during operation, it can be regarded that an AC voltage is supplied by the power source V1, and the voltage of the ground GND is higher than the voltage of the negative charge on the electrically controlled deformable film 3. Hence, the ground GND discharges to the electrically controlled deformable film 3. The current I flows through the third thin film transistor M3 to the electrically controlled deformable film 3 successively.

It should be noted that in the case that the lower substrate 2 is an array substrate, a pixel unit array is formed on the lower substrate. The pixel unit array is generally provided with a GOA circuit. The GOA circuit can be disposed at one side of the pixel unit array (i.e., unilateral drive), and can also be disposed at two sides of the pixel unit array (i.e., bilateral drive). According to another embodiment, the GOA circuit is disposed at two sides of the pixel unit array, thereby enabling the non-display area at the two sides to be uniform, which is advantageous for realizing a narrow frame display panel. Accordingly, the power source signal line electrically connected with the electrically controlled deformable film 3 and the power supply protection circuit 6 for providing power supply circuit protection are disposed at one side of the pixel unit array. The ground signal line electrically connected with the electrically controlled deformable film 3 and the ESD protection circuit 7 for providing ESD protection can be disposed at the other side of the pixel unit array.

According to another embodiment, the material of the electrically controlled deformable film 3 is an electro deformable SMP material. In this embodiment, the electro deformable SMP material has both conductivity and good shape memory function. The curvature of the electrically controlled deformable film can be changed by adjusting the voltage applied on it, thereby enabling the curvatures of the upper substrate 1 and the lower substrate 2 that are packaged together to be adjusted synchronously, thus, the curvature of the display panel can be adjusted flexibly.

According to another embodiment, a thickness of the electrically controlled deformable film 3 is 100 μm to 200 μm.

According to another embodiment, the lower substrate 2 is an array substrate, and the upper substrate 1 is a color film substrate or a package substrate. For example, in the case that the display panel is a display panel of a liquid crystal display device, the upper substrate 1 is a color film substrate, and the lower substrate 2 is an array substrate. Certainly, liquid crystals also have to be arranged between the upper substrate 1 and the lower substrate 2. For example again, in the case that the display panel is a display panel of an LED display device, the upper substrate 1 is a package substrate, and the lower substrate 2 is an array substrate. Certainly, an LED light emitting device also has to be arranged on the lower substrate 2, which will not be repeated here.

By arranging the curvature adjustable electrically controlled deformable film on the surface of the upper substrate facing away from the lower substrate, when the curvature of the display panel needs to be adjusted, the voltage applied on the electrically controlled deformable film can be changed, such that the curvature of the electrically controlled deformable film is changed and the upper substrate and the lower substrate that are packaged together are driven to change their curvatures synchronously, so as to adapt to the change of the viewer position and adjust the curvature of the display panel flexibly.

An embodiment of the present disclosure further provides a display device, comprising the display panel provided by any of the embodiments as above.

By arranging the curvature adjustable electrically controlled deformable film on the surface of the upper substrate facing away from the lower substrate, when the curvature of the display panel needs to be adjusted, the voltage applied on the electrically controlled deformable film can be changed, such that the curvature of the electrically controlled deformable film is changed and the upper substrate and the lower substrate that are packaged together are driven to change their curvatures synchronously, so as to adapt to the change of the viewer position and adjust the curvature of the display panel flexibly.

Figure 11:
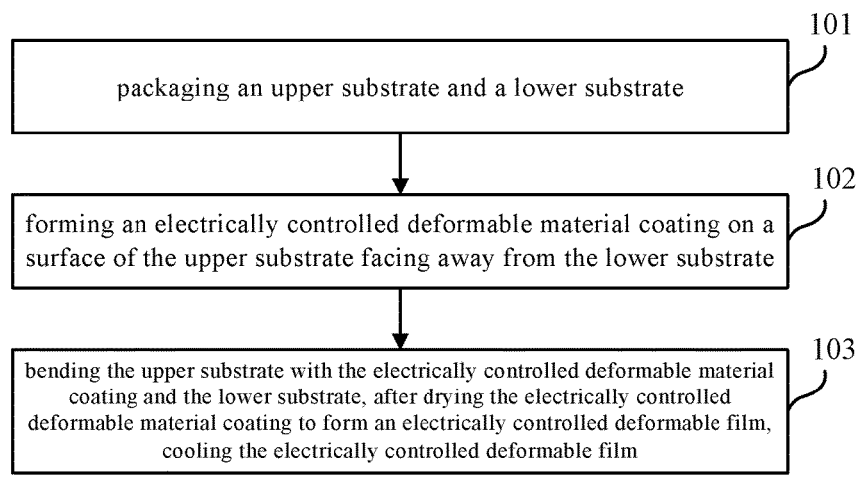
FIG. 11 is a flow chart of a manufacturing method of a display panel provided by an embodiment of the present disclosure.

As shown in FIG. 11, an embodiment of the present disclosure further provides a manufacturing method of a display panel, comprising:

101, packaging an upper substrate and a lower substrate;

102, forming an electrically controlled deformable material coating on a surface of the upper substrate facing away from the lower substrate;

103, bending the upper substrate with the electrically controlled deformable material coating and the lower substrate, after drying the electrically controlled deformable material coating to form an electrically controlled deformable film, cooling the electrically controlled deformable film.

According to another embodiment, forming an electrically controlled deformable material coating on a surface of the upper substrate facing away from the lower substrate comprises: after coating an electrically controlled deformable material on the surface of the upper substrate facing away from the lower substrate, forming an electrically controlled deformable material coating through natural volatilization or prebaking of 30 degrees Celsius.

According to another embodiment, the method can further comprise:

prior to packaging the upper substrate and the lower substrate, forming a power source signal line and a ground signal line on the lower substrate; and after cooling the electrically controlled deformable film, forming a first electrically conductive component electrically connected with the power source signal line and a second electrically conductive component electrically connected with the ground signal line on different ends of the electrically controlled deformable film respectively.

According to another embodiment, silver paste can be used to form the first electrically conductive component and the second electrically conductive component.

According to another embodiment, the method can further comprise: prior to packaging the upper substrate and the lower substrate, forming a power supply protection circuit and an ESD protection circuit on the lower substrate, the power supply protection circuit being electrically connected with the power source signal line, and the ESD protection circuit being electrically connected with the ground signal line. In the display panel formed, the power supply protection circuit can be disposed between the power source signal line on the lower substrate and the first electrically conductive component electrically connected with the power source signal line, and the ESD protection circuit can be disposed between the ground signal line on the lower substrate and the second electrically conductive component electrically connected with the ground signal line.

By arranging the curvature adjustable electrically controlled deformable film on the surface of the upper substrate facing away from the lower substrate, when the curvature of the display panel needs to be adjusted, the voltage applied on the electrically controlled deformable film can be changed, such that the curvature of the electrically controlled deformable film is changed and the upper substrate and the lower substrate that are packaged together are driven to change their curvatures synchronously, so as to adapt to the change of the viewer position and adjust the curvature of the display panel flexibly.

Apparently, the skilled person in the art can make various amendments and modifications to the present disclosure without departing from the spirit and the scope of the present disclosure. In this way, provided that these amendments and modifications of the present invention belong to the scopes of the claims of the present disclosure and the equivalent technologies thereof, the present disclosure also intends to encompass these amendments and modifications.

The invention claimed is:

1. A display panel, comprising an upper substrate and a lower substrate arranged opposite to each other and packaged together, wherein the display panel further comprises an electrically controlled deformable film, the electrically controlled deformable film is arranged on a surface of the upper substrate facing away from the lower substrate; and wherein the electrically controlled deformable film is configured to adjust its curvature based on a voltage applied on the electrically controlled deformable film, and enable a curvature of the upper substrate and a curvature of the lower substrate to be adjusted synchronously, wherein a first end of the electrically controlled deformable film is electrically connected with a power source signal line on the lower substrate, a second end of the electrically controlled deformable film is electrically connected with a ground signal line, wherein the first end and the second end are opposite to each other and both attached to a surface of the upper substrate facing away from the lower substrate, wherein a power supply protection circuit is disposed on a surface of the lower substrate facing towards the upper substrate, the power supply protection circuit is electrically connected with the power source signal line and configured to protect the power source signal line, wherein the first end of the electrically controlled deformable film is electrically connected with the power supply protection circuit through a first electrically conductive component.

2. The display panel as claimed in claim 1, wherein shape and size of the electrically controlled deformable film match with the upper substrate.

3. A display device, comprising a display panel as claimed in claim 2.

4. The display panel as claimed in claim 1, wherein the power supply protection circuit comprises a first thin film transistor, and wherein a gate electrode and a source electrode of the first thin film transistor are electrically connected with the power source signal line, and a drain electrode of the first thin film transistor is electrically connected with the first electrically conductive component.

5. A display device, comprising a display panel as claimed in claim 4.

6. The display panel as claimed in claim 1, wherein an ESD protection circuit electrically connected with the ground signal line is disposed on the surface of the lower substrate facing towards the upper substrate, and the other of two opposite ends of the electrically controlled deformable film is electrically connected with the ESD protection circuit through a second electrically conductive component.

7. The display panel as claimed in claim 6, wherein the ESD protection circuit comprises a second thin film transistor and a third thin film transistor, wherein a gate electrode and a source electrode of the second thin film transistor, and a drain electrode of the third thin film transistor are electrically connected with the second electrically conductive component, and wherein a drain electrode of the second thin film transistor, and a gate electrode and a source electrode of the third thin film transistor are electrically connected with the ground signal line.

8. The display panel as claimed in claim 7, wherein the first electrically conductive component and the second electrically conductive component are silver points.

9. A display device, comprising a display panel as claimed in claim 7.

10. A display device, comprising a display panel as claimed in claim 8.

11. A display device, comprising a display panel as claimed in claim 6.

12. The display panel as claimed in claim 1, wherein a material of the electrically controlled deformable film is an electro deformable material.

13. The display panel as claimed in claim 12, wherein a thickness of the electrically controlled deformable film is 100 μm to 200 μm.

14. The display panel as claimed in claim 1, wherein the lower substrate is an array substrate, and the upper substrate is a color film substrate or a package substrate.

15. A display device, comprising a display panel as claimed in claim 1.

16. A manufacturing method of a display panel, comprising:
   packaging an upper substrate and a lower substrate;
   forming an electrically controlled deformable material coating on a surface of the upper substrate facing away from the lower substrate;
   bending the upper substrate with the electrically controlled deformable material coating and the lower substrate, after drying the electrically controlled deformable material coating to form an electrically controlled deformable film, cooling the electrically controlled deformable film.

17. The manufacturing method of a display panel as claimed in claim 16, wherein forming an electrically controlled deformable material coating on a surface of the upper substrate facing away from the lower substrate comprises:
   after coating an electrically controlled deformable material on the surface of the upper substrate facing away from the lower substrate, forming an electrically controlled deformable material coating through natural volatilization or pre-baking of 30 degrees Celsius.

18. The manufacturing method of a display panel as claimed in claim 16, further comprising:
   prior to packaging the upper substrate and the lower substrate, forming a power source signal line and a ground signal line on the lower substrate; and
   after cooling the electrically controlled deformable film, forming a first electrically conductive component electrically connected with the power source signal line and a second electrically conductive component electrically connected with the ground signal line on different ends of the electrically controlled deformable film respectively.

19. The manufacturing method of a display panel as claimed in claim 18, further comprising:
   prior to packaging the upper substrate and the lower substrate, forming a power supply protection circuit and an ESD protection circuit on the lower substrate, wherein the power supply protection circuit is electrically connected with the power source signal line, and the ESD protection circuit is electrically connected with the ground signal line.

* * * * *